United States Patent [19]
Hashimoto

[11] Patent Number: 5,438,538
[45] Date of Patent: Aug. 1, 1995

[54] STATIC RANDOM ACCESS MEMORY FOR GATE ARRAY DEVICES

[75] Inventor: Masashi Hashimoto, Tsukuba, Japan

[73] Assignee: Texas Instruments Incorporated, Dallas, Tex.

[21] Appl. No.: 312,165

[22] Filed: Sep. 26, 1994

Related U.S. Application Data

[63] Continuation of Ser. No. 951,965, Sep. 28, 1992, abandoned.

[51] Int. Cl.$^6$ ............................................. G11C 11/00
[52] U.S. Cl. .................................... 365/154; 365/156
[58] Field of Search ............................... 365/154–156, 365/181, 190, 189.09, 189.11

[56] References Cited

U.S. PATENT DOCUMENTS

| | | | |
|---|---|---|---|
| 3,936,811 | 2/1976 | Horninger | 365/154 |
| 3,969,708 | 7/1976 | Sonoda | 365/154 |
| 4,128,773 | 12/1978 | Troutman | 365/228 |
| 4,460,978 | 7/1984 | Jiang | 365/154 |
| 4,636,983 | 1/1987 | Young | 365/181 |

Primary Examiner—Joseph A. Popek
Assistant Examiner—A. Zarabian
Attorney, Agent, or Firm—John D. Crane; James C. Kesterson; Richard L. Donaldson

[57] ABSTRACT

A gate array device (10) includes a plurality of static random access memory cells (11). Each memory cell (11) comprises n-channel pass gate transistors (12, 14), n-channel drive transistors (16, 18), and p-channel transistors (20, 22). All transistors within the memory cell (11) are approximately of the same size. A resistance element (23) connects to the p-channel transistors (20, 22) in each memory cell (11), generating a new supply voltage ($\overline{V}_{cr}$). The resistance element (23) effectively reduces the size of the p-channel transistors (20, 22) to below the size of the drive transistors (16, 18). By effectively reducing the size of the p-channel transistors (20, 22), the speed, accuracy, and stability of the memory cell (11) are enhanced despite the similar sizes of the transistors in the gate array device (10).

17 Claims, 1 Drawing Sheet

STATIC RANDOM ACCESS MEMORY FOR GATE ARRAY DEVICES

This application is a continuation of application Ser. No. 07/951,965, filed Sep. 28, 1992, now abandoned.

TECHNICAL FIELD OF THE INVENTION

This invention relates in general to integrated circuit devices and more particularly to a static random access memory for gate array devices.

BACKGROUND OF THE INVENTION

Conventional static random access memory cells are constructed with n-channel pass gate transistors activated by address lines. The n-channel pass gate transistors drive n-channel driver transistors and p-channel transistors within the memory cell. To achieve high speed with low power read/write operation, the gate width of the pass gate transistors is typically about one-third that of the driver transistors and the gate width of the p-channel transistors are the same as or smaller than the gate width of the pass gate transistors. Such size configurations achieve high speed with low power read/write operation and allow the memory cell to perform data write operation properly.

In gate array devices, however, there is no control over the size of particular transistors and the circuit designer must make due with the transistors available. The transistors in a gate array device are of approximately the same size to maintain signal rise and fall times as equal as possible. Similar size base cell transistors within a gate array make static random access memory cell design difficult. It is therefore desirable to have a static random access memory in a gate array device that overcomes the size limitations of the available transistors.

From the foregoing, it may be appreciated that a need has arisen to provide a static random access memory cell for a gate array device that optimally performs despite the similarly sized base cell transistors in the gate array. A need has also arisen to provide a static random access memory cell for a gate array device that effectively reduces transistor sizes to enhance performance of the memory cell.

SUMMARY OF THE INVENTION

In accordance with the present invention, a static random access memory for gate array devices is provided which substantially eliminates or reduces disadvantages and problems associated with prior art gate array based static random access memories.

The present invention includes a plurality of base cell transistors in a gate array having approximately the same size. The base cell transistors include n-channel transistors and p-channel transistors connected into static random access memory cells. A resistance element couples to the p-channel transistors to effectively reduce the size of the p-channel transistors below the size of the n-channel transistors, increasing speed and stability of the memory cell.

The static random access memory cell of the present invention provides for various technical advantages over gate array static random access memories within the prior art. For example, one technical advantage is in enhancing the speed and stability of the memory cell using only base cell transistors of a gate array. Another technical advantage is in overcoming the similar size of base cell transistors within a gate array for static random access memory design. Still another technical advantage is in effectively reducing the size of particular transistors to improve data write operation performance. Other technical advantages are readily apparent to one skilled in the art from the following descriptions, figures, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figure 1:
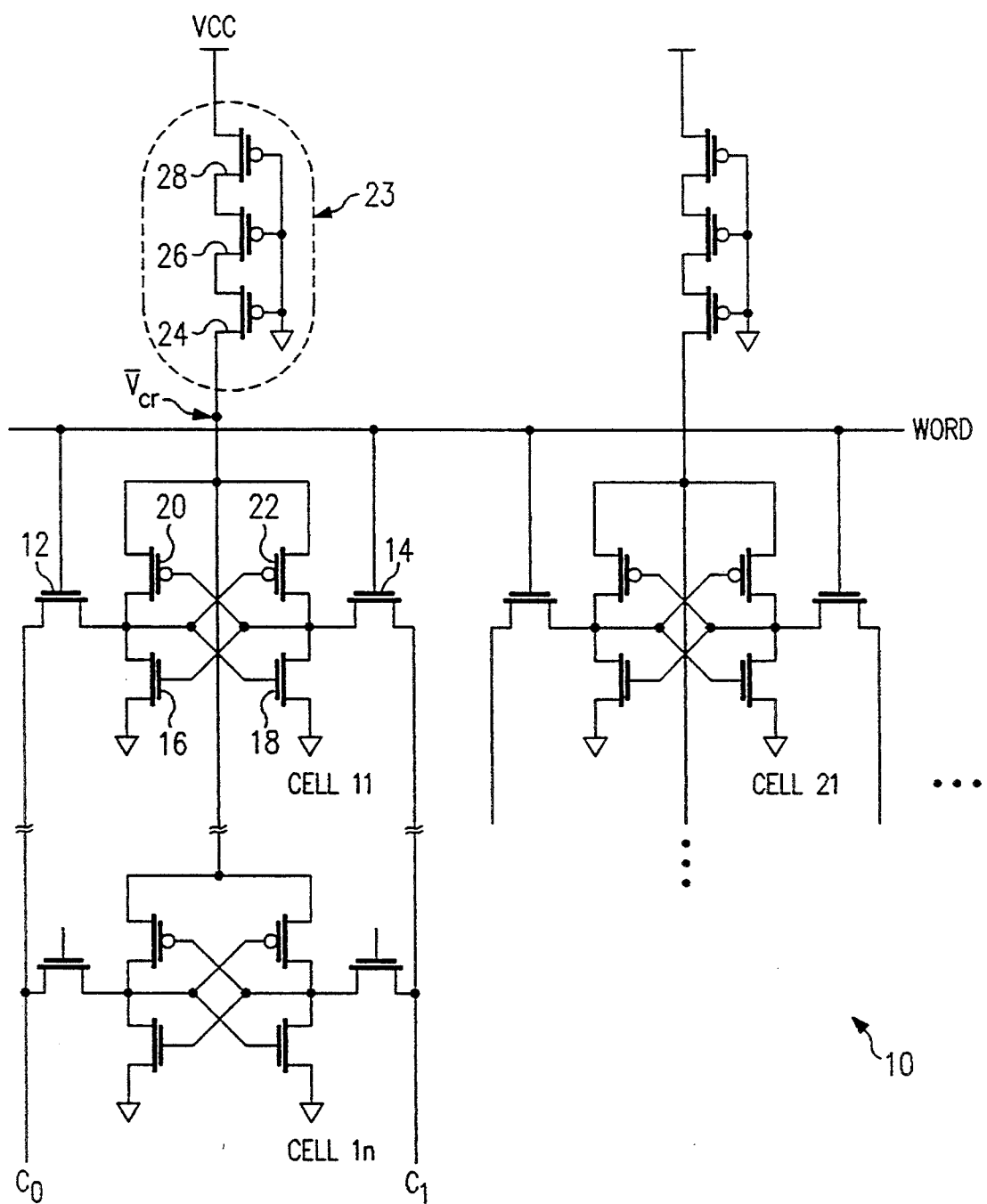
FIG. 1 illustrates a simplified schematic diagram of a preferred static random access memory for a gate array device.

FIG. 1 is a schematic diagram of a gate array device 10. Gate array device 10 includes a plurality of static random access memory cells as exemplified by cell 11. Cell 11 includes n-channel pass gate transistors 12 and 14 having sources connected to column address lines $C_O$ and $C_1$, respectively, and gates connected to row address line word. Pass gate transistor 12 has a drain connected to a drain of an n-channel driver transistor 16 and to a gate of an n-channel driver transistor 18. The drain of pass gate transistor 12 also connects to a source of a p-channel transistor 20 and a gate of a p-channel transistor 22. Pass gate transistor 14 has a drain connected to a gate of driver transistor 16 and to a drain of driver transistor 18. The drain of pass gate transistor 14 also connects to a gate of p-channel transistor 20 and to a source of p-channel transistor 22. The sources of driver transistors 16 and 18 connect to a neutral voltage level such as ground. The drains of p-channel transistors 20 and 22 connect to a resistance element 23, preferably comprising p-channel transistors 24, 26, and 28. P-channel transistors 24, 26, and 28 connect to supply voltage VCC.

Resistance element 23 effectively reduces the size of p-channel transistors 20 and 22 to below the size of driver transistors 16 and 18. Resistance element 23 generates a new supply voltage at point $\overline{V}_{cr}$ for each static random access memory cell 11 in a particular column. Though newly generated supply voltage $\overline{V}_{cr}$ is connected to each memory cell 11 in the same column, the data in the cells located in the same column will not be destroyed by a voltage drop at the common $\overline{V}_{cr}$ supply point due to a cell read/write operation, since only one cell per column is selected at a time by an appropriate address signal. However, a parasitic capacitance at supply point $\overline{V}_{cr}$ may become a cause of write operation deceleration since the generated supply voltage is tied to each cell within a column. For high speed write operation, it may be necessary to split the generated $\overline{V}_{cr}$ supply voltage into appropriate sections by using more than one resistance element 23 for each column in the array.

Since gate arrays are fabricated with generic switching MOS transistors for a wide variety of applications, transistors within a gate array do not have optimal performance characteristics and are of a bigger size as compared to custom fabricated transistors. For appropriate static random access memory operation, the p-channel transistors are as small as the pass gate transistors and much smaller than the drive transistors. However, in a gate array device, the p-channel switching transistors are as large as or larger than the n-channel switching transistors, making it difficult to flip the latch formed by the transistors for proper memory cell operation. Resistance element 23 provides a mechanism to enhance performance of sub-optimal generic gate array transistors by weakening the p-channel transistors to effectively reduce the size of the p-channel transistors. The amount of resistance provided by resistance element 23 determines how much the p-channel transistors weaken and thus the amount of effective reduction of the size of the p-channel transistors. For proper operation, the amount of resistance provided by resistance element 23 should be sufficient to effectively reduce the size of the p-channel transistors to half the size of the n-channel transistors.

Thus, it is apparent that there has been provided in accordance with the present invention, a static random access memory for a gate array device that satisfies the advantages set forth above. Although the preferred embodiment has been described in detail, it should be understood that various changes, substitutions, and alterations can be made herein. For example, resistance element 23 may be comprised of components other than p-channel transistors as shown in the preferred embodiment. Also, one skilled in the art may vary the transistor technologies from those shown in the preferred embodiment. Other examples are readily ascertainable by one skilled in the art and could be made without departing from the spirit and scope of the present invention as defined by the following claims.

What is claimed is:

1. A gate array device, comprising:
   a plurality of static random access memory cells, each memory cell having n-channel and p-channel transistors of approximately a same size, said n-channel transistors and said p-channel transistors being configured in pairs of series connected transistors of opposite channel type which conduct current only during reading from or writing to said cells; and
   a resistance element coupled to said memory cells, said resistance element being operative to increase speed and stability of said memory cells so as to have substantially the speed and stability of optimally designed memory cells having p-channel transistors which are physically smaller than the n-channel transistors in the cell.

2. The gate array device of claim 1, further comprising a plurality of resistance elements, said memory cells partitioned into columns and rows, each resistance element coupled to a separate column of said memory cells.

3. The gate array of claim 2 wherein each said resistance element connects to the p-channel transistors of each memory cell in a separate column of memory cells.

4. The gate array device of claim 3, wherein each said resistance element comprises a plurality of connected resistance elements to reduce parasitic capacitance from said resistance elements.

5. A static random access memory cell for CMOS gate array devices comprising, in combination:
   a plurality of only p-channel and n-channel MOS switching transistors, each of said transistors being approximately the same physical size said transistors being interconnected to form a static random access memory cell including two pairs of series connected p-channel and n-channel MOS switching transistors which causes the transistors in said memory cell to conduct current substantially only during reading data from or writing data to said memory cell; and
   a resistor element coupled in series with said pairs of series connected p-channel and n-channel transistors to increase the speed and stability of said memory cell.

6. A static random access memory cell for a CMOS gate array device comprising, in combination:
   a first and a second n-channel pass gate transistor, each said pass gate transistor having a gate, a source and a drain, the gate of each said pass gate transistor being connected to a signal line for activating the memory cell;
   a first and a second n-channel driver transistor, each said driver transistor having a gate, a source and a drain, the source of both said driver transistors being connected to a neutral voltage supply, said first driver transistor having its gate connected to the drain of said second pass gate transistor and having its drain connected to the drain of said first pass gate transistor, said second driver transistor having its gate connected the drain of said first pass gate transistor and having its drain connected to the drain of said second pass gate transistor;
   first and second p-channel transistors, each having a gate, a source and a drain, said p-channel transistors being coupled to said pass gate and driver transistors, said first p-channel transistor having its gate connected to the gate of said first driver transistor and having its source connected to the drain of said first driver transistor, said second p-channel transistor having its gate connected to the gate of said second driver transistor and having its source connected to the drain of said second driver transistor;
   all of said n-channel and p-channel transistors being of approximately the same physical size; and
   a resistance element coupled between the drain of said first and second p-channel transistors and a supply voltage.

7. A static random access memory for a CMOS gate array comprising, in combination:
   a plurality of static random access memory cells arranged in columns and rows, each cell consisting of:
      a first and a second n-channel pass gate transistor, each said pass gate transistor having a gate, a source and a drain, the gate of each said pass gate transistor being connected to a signal line for activating the memory cell;
      a first and a second n-channel driver transistor, each said driver transistor having a gate, a source and a drain, the source of both said driver transistors being connected to a neutral voltage supply, said first driver transistor having its gate connected to the drain of said second pass gate transistor and having its drain connected to the drain of said first pass gate transistor, said second driver transistor having its gate connected the drain of said first pass gate transistor and having its drain connected to the drain of said second pass gate transistor;
      first and second p-channel transistors, each having a gate, a source and a drain, said p-channel transistors being coupled to said pass gate and driver transistors, said first p-channel transistor having its gate connected to the gate of said first driver transistor and having its source connected to the drain of said first driver transistor, said second p-channel transistor having its gate connected to the gate of said second driver transistor and having its source connected to the drain of said second driver transistor;

all of said n-channel and p-channel transistors being of approximately the same physical size; and a resistance element coupled between the drain of said first and second p-channel transistors of all said memory cells in each column of cells and a supply voltage.

8. The memory of claim 7 wherein said resistance element comprises a third p-channel transistor.

9. The memory of claim 8 wherein said third p-channel transistor has a source connected to said drains of said first and second p-channel transistors of each memory cell in a column of cells and a gate connected to said neutral voltage supply.

10. The memory cell of claim 7 wherein said resistance element comprises a plurality of p-channel transistors connected in series to said supply voltage.

11. The memory cell of claim 5, wherein said resistance element couples a supply voltage to said p-channel transistors.

12. The memory cell of claim 5, wherein said resistance element comprises a p-channel transistor.

13. The memory cell of claim 5, wherein said resistance element comprises a plurality of p-channel transistors connected in series to a supply voltage.

14. The memory cell of claim 5, wherein said resistance element connects to a drain of each p-channel transistor.

15. The memory cell of claim 6, wherein said resistance element comprises a p-channel transistor.

16. The memory cell of claim 6, wherein said p-channel transistor has a source connected to said drains of said first and second p-channel transistors and a gate connected to said neutral voltage supply.

17. The memory cell of claim 6, wherein said resistance element comprises a plurality of p-channel transistors connected in series to said supply voltage.

* * * * *